US005917919A

United States Patent [19]

Rosenthal

[11] Patent Number: 5,917,919

[45] Date of Patent: Jun. 29, 1999

[54] METHOD AND APPARATUS FOR MULTI-CHANNEL ACTIVE CONTROL OF NOISE OR VIBRATION OR OF MULTI-CHANNEL SEPARATION OF A SIGNAL FROM A NOISY ENVIRONMENT

[76] Inventor: Felix Rosenthal, 4020 Iva La., Annandale, Va. 22003

[21] Appl. No.: 08/759,769

[22] Filed: Dec. 3, 1996

Related U.S. Application Data

[60] Provisional application No. 60/007,949, Dec. 4, 1995.

[51] Int. Cl.[6] .................... H03B 29/00

[52] U.S. Cl. .................... 381/71.11

[58] Field of Search .................... 364/724.19; 381/71.11, 381/71.12, 94.1, 94.9, 71.8

[56] References Cited

U.S. PATENT DOCUMENTS 5,209,237 5/1993 Rosenthal .................... 364/724.19

5,577,127 11/1996 Van Overbeek .................... 381/71.11

*Primary Examiner*—Vivian Chang

*Attorney, Agent, or Firm*—Hazel & Thomas, P.C.

[57] ABSTRACT

The present invention is directed to a system and method for feed-forward active control of noise and vibration. In operation, at least one of noise and vibration from potential noise and vibration sources are detected, and noise reference data based on the detection of noise and vibration from the potential noise and vibration sources is generated. Further, at least one of noise and vibration at a selected environment in which noise and vibration are to be minimized are also detected, whereby error data based on the detection of noise and vibrations at the selected environment is generated. Filter constants are generated based on the noise reference data and the error data, wherein the generating of the filter constants includes the elimination of redundancies in the noise reference data. The noise reference data is processed based on the generated filter constants, whereby noise/vibration canceling outputs based on the processed noise reference data is generated to minimize energy of the noise and vibration detected at the selected environment.

45 Claims, 5 Drawing Sheets

METHOD AND APPARATUS FOR MULTI-CHANNEL ACTIVE CONTROL OF NOISE OR VIBRATION OR OF MULTI-CHANNEL SEPARATION OF A SIGNAL FROM A NOISY ENVIRONMENT

This application is being filed based on the priority of the Provisional Application No. 60/007,949, filed Dec. 4, 1995, the contents of which are hereby incorporated by reference.

BACKGROUND OF THE INVENTION

The present invention relates to the cancellation of noise or vibration signals using a plurality of reference sensors, actuators, and/or error sensors; a method termed multi-channel control, and to a control computer or controller capable of performing the functions required to accomplish such control. It relates in particular to both (1) the multi-channel active control of noise or vibration, and (2) the multi-channel separation of a signal from a noisy environment.

Multi-channel active control of unwanted noise or vibration signals is applicable to a variety of circumstances in which noise and vibration occur. Three examples are: the active control of noise in interior spaces such as aircraft or automobiles; the active control of low level low frequency vibration in high precision manufacturing machinery such as that used in the semiconductor industry; and the mitigation of traffic noise in residential areas near major highways.

Multi-channel signal separation of unwanted noise or vibration signals, on the other hand, is applicable to a different set of circumstances. Examples of applications are the removal of own-vehicle noise from detection microphones mounted exterior to a military vehicle (i.e., a HumVee); the removal of unwanted signals from measurements by scientific or medical instruments such as the removal of muscle artifact from electro-encephalograms performed on patients while relevant muscles are active as during an epileptic seizure; and the removal of several kinds of interference in telecommunications.

In the case of active control, it is known in the art that unwanted noise or vibration present in a physical environment can be mitigated by generating signals or vibrations to counter the unwanted noise or vibrations. In the case of so-called feed-forward active control, it is known in the art that noise or vibration reference sensors can be advantageously used to characterize the noise or vibration to be removed from the physical environment by applying loudspeakers or other actuators to cancel the offending noise or vibration.

In the case of signal separation, it is known in the art that unwanted noise appearing in a measurement can be removed from that measurement by the use of noise reference sensors. Such sensors are capable of characterizing the noise appearing in the primary (signal) sensor, thereby allowing the subtraction of that noise from the signal out of the primary sensor to obtain a corrected low-noise output.

In both active control and signal separation, it has been recognized that it is sometimes advantageous to use multi-channel control, generally involving the use of more than a single reference sensor, when there is more than a single independent source of noise to be canceled. However, it has also been recognized in the prior art that there is a limit on the number of reference sensors that can be used effectively. It has been a problem in the art that there is no known method for ascertaining the precise number and optimal locations of reference sensors required to provide effective cancellation of the noise appearing in either the physical environment (active control) or the signal from a primary sensor (signal separation). Furthermore in the case of signal separation, under most circumstances it is not possible to obtain a reference sensor reading which is totally free of the primary signal, which as a result can lead to cancellation of the primary signal itself when "too many" reference sensors are used.

Consequently, a primary problem with approaches to the multi-channel control of noise or vibration (either active or signal separation) is the inevitable presence of redundant information in the noise or vibration reference measurements. This problem is described below in greater detail for the particular case of active control. The problem as well as its solution are essentially the same for the case of signal separation.

In general, active noise control uses adaptive filtering to drive loudspeaker "actuators" to cancel existing noise or vibration, by producing antinoise or vibration. Adaptive filtering is a long-known (since the 1940's) way of filtering that uses the statistical properties of signals. It can separate signals, even when they are in the same frequency band. If such signals are statistically independent, they can in principle be separated perfectly.

As is well known in the prior art, Norbert Wiener derived the simple matrix equation that must be solved to obtain filter coefficients for active control. Optimal filter values are derived by solving this matrix equation or inverting the matrix. However, inverting even modest size matrices in real time is a computation intensive task. In the 1960's Bernard Widrow partially solved this problem by inventing the now famous LMS algorithm, which, by an ingenious gradient approach that iteratively or recursively computes the filter coefficients, eliminates the need for inverting matrices. Since the creation of the LMS algorithm, numerous other algorithms, including the Filtered-X and others, have been superimposed on the original LMS algorithm to solve such problems as updating system transfer functions.

The LMS algorithm is simple and computationally efficient. So much so, in fact, that the LMS algorithm has been over-used or even misused. In particular, the Wiener Filter equation, which the LMS algorithm as presently used and other algorithms derived from it attempt to solve, sometimes (and in practice often) does not have a solution. As is well known, two simultaneous equations (a matrix equation) in which one equation is simply a multiple of the other cannot be solved. Unfortunately, this is what happens analogously whenever two noise reference sensors pick up the same noise source. The LMS algorithm and its derivatives must and will fail when the underlying Wiener Filter equation does not have a solution because of singularity or ill-condition.

The concepts of active noise control, feedforward control, the LMS algorithm, the Filtered-X algorithm, Wiener Filters and others, as mentioned above and as will be used hereinafter, are consistent with those as explained in texts such as *Active Control of Vibration*, Academic Press Limited, London, England (1996) to C. R. Fuller et al.; *Active Noise Control Systems: Algorithms and DSP Implementations*, John Wiley & Sons, Incorporated, New York, N.Y. (1996) to S. M. Kuo et al.; and *Adaptive Signal Processing*, Prentice-Hall Incorporated, Englewood Cliffs, N.J. (1985) to B. Widrow et al., all of which are hereby incorporated by reference.

SUMMARY OF THE INVENTION

In order to perform multi-channel active (or signal separation) control effectively, it is necessary to remove redundancies in the available reference sensor measurements, prior to calculating the Wiener Filters that are required to drive the actuators in the case of active control, or subtract the noise from a signal in the case of signal separation. The recognition of this fact and the removal of these offending redundancies using any of a number of possible processes is termed the Signal-Free Reference using Singular-Value Decomposition Method (hereinafter, the SFR-SVD method), and is encompassed by the present invention as set forth hereinbelow. The concept of the SFR-SVD method is set forth in U.S. Pat. No. 5,209,237 issued on May 11, 1993, which is hereby incorporated by reference.

The SFR-SVD method insures that all destructive redundancies in reference sensor measurements are removed prior to adaptive calculation or updating of the cancellation filters. As stated above, these redundancies must be removed in order for cancellation to take place effectively. There are several methods for the process of removing the redundancies. The process can be performed in the time-domain using the relevant cross-correlation matrices, or it can be done in the frequency domain using cross spectral density matrices. Numerical algorithms other than singular-value decomposition that can be used to eliminate redundant information include the method of Principal Components, Gram-Schmidt orthogonalization, in addition to Singular-Value Decomposition. In the case of each of these methods, the redundancies are eliminated by ignoring the information corresponding to sources of noise or vibration below a particular preset threshold. When the SFR-SVD method is applied, more sensors can be added without risking unsolvable filter equations.

Redundancy and other problems are overcome in accordance with the present invention with an arrangement employing a number of noise or vibration reference signal detectors, by eliminating the detrimental effects resulting from the inclusion of reference sensor contributions which do not represent significant independent noise sources, prior to determining filter constants. The filter constants are used to condition the reference outputs before they are applied to actuators (in active noise/vibration control) or subtracted from the primary sensor output signal (in signal separation). In accordance with one aspect of the invention, the computation of filtering constants to be used in the filtering algorithm involves setting thresholds on the computation process and eliminating from the computation values falling below the threshold.

As a result, one advantage achieved by the present invention is that the number of reference sensors selected can be safely increased to where no additional possible noise sources might be included as a result of adding another reference.

A further advantage of the present invention implemented in active control is that a required system transfer function from the actuators to the error sensors can be updated without resorting to having separate probe signals measure the characteristics of the transfer function, as is done in the well-known Filtered-X algorithm.

Still another advantage of the present invention implemented in active control is that a singular-value decomposition or another analogous method of removing redundancies in the reference sensor measurements can also be applied to other instances in solving the active control problem where possibly ill-conditioned matrices need to be inverted. These other instances relate to the need to update the system transfer functions as well as the Wiener Filter constants, and are discussed in greater detail hereinbelow.

A further advantage of the present invention implemented in signal separation is that the present invention avoids the inadvertent cancellation of signal components due to inclusion of small amounts of the true signal in the reference sensor outputs and the uncertainty of results in the prior art when in effect more reference detectors are used than there are actual noise sources.

In accordance with one aspect, a controller device of the present invention calculates a set of filtered noise/vibration reference signals for driving anti-noise/vibration actuators (in the case of active control), or for subtracting noise from the measured primary signals to be detected in order to obtain corrected signals (in the case of signal separation). In either case, these filtered reference signals are generated by deriving correlation data for the several reference outputs and using the correlation data together with error or primary signal data to generate information defining filter constants representing certain linear combinations of reference outputs. Only those source contributions to reference sensors for which correlation values exceed a predetermined threshold value are taken into account in defining the filter constants. Contributions falling below the threshold are eliminated from consideration. The filter constants are applied to the reference outputs, and the filtered reference outputs are used to drive actuators or are subtracted from the primary output in order to remove the effect of noise sources from the primary sensor output signal. Correlation data of small magnitude, when compared to other correlation data values, may be eliminated from the filter constant computation process, since the small value data do not represent any independent noise sources. Furthermore in the case of signal separation, primary source signal values included in small value correlation data where such signal values may have significant influence, are advantageously eliminated.

In an active control system, the physical disturbances of sound or vibration are canceled by having two separate and mutually compensating paths for the noise to travel from the source to the error sensors: First, the so-called plant path exists even when there is no noise control system at all. Therefore, a noise control system's control path must optimally cancel the sound or vibration coming through the plant path. The control path consists of the following elements in series: the reference sensors picking up the noise or vibration at their source, and the Wiener Filters and the actuators. Between the actuators and the error sensors, there exist unknown system transfer functions which enter into the filter calculations and must therefore be either measured or adjusted adaptively for optimum performance.

The problem of latency is that the reference filtering computations performed by the noise controller system should if possible be performed in a period of time not greater than the time taken for the disturbance to traverse the plant path. Otherwise, the filtered reference information will arrive at the error sensors too late to cancel higher frequency transient disturbances from the source, and the noise control system will then at best be able to handle the more steady disturbances. The time available for the actual calculation of optimal filters, on the other hand, is generally not so severely limited. These calculations must merely keep up with the lack of stationarity of the noise, but are not subject to any constraints from the latency time which is generally much shorter.

BRIEF DESCRIPTION OF THE DRAWINGS

The invention is described with reference to the drawings in which.

DETAILED DESCRIPTION OF THE PREFERRED EMBODIMENTS

Figure 1:
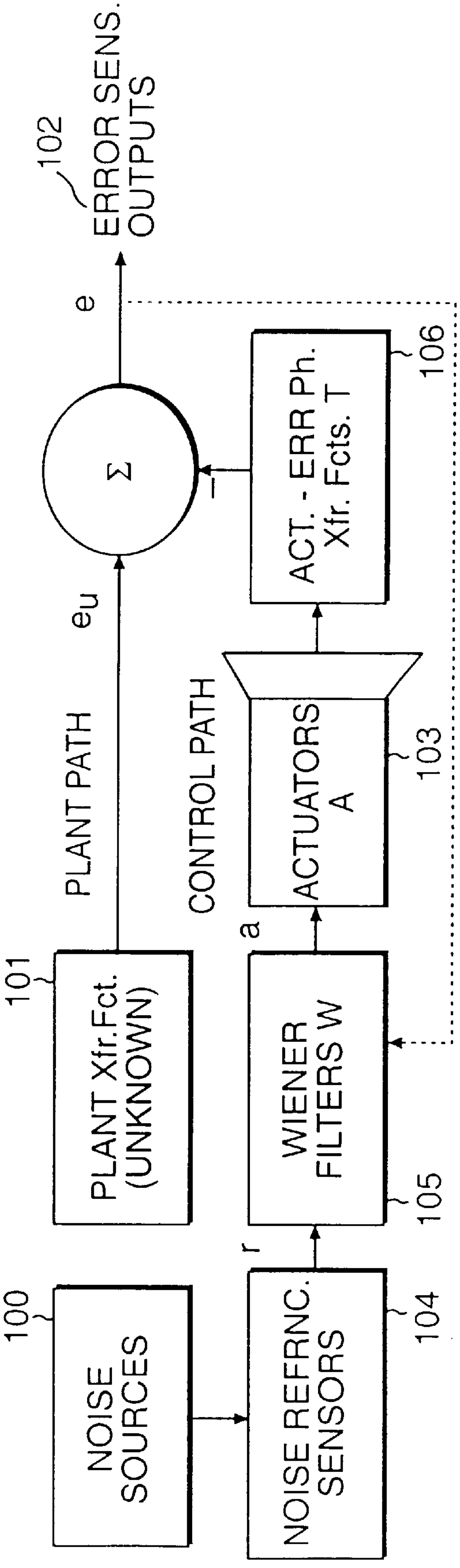
FIG. 1 depicts the data flow in a typical feed-forward active control system, capable of actively controlling either noise or vibration according to the present invention, wherein the system contains a plurality of noise or vibration reference sensors, a plurality of actuators including loudspeakers or piezo-electric transducers, and a plurality of error sensors.

With reference to the figures, like reference characters will be used to indicate like elements throughout the several embodiments and views thereof. In particular, FIG. 1 is a block data flow diagram showing how a state-of-the-art feed-forward active control system is intended to work. As illustrated, outputs from a plurality of noise or vibration sources (Noise Sources 100) travel through an unknown so-called Plant Path 101 directly to the plurality of K Error Sensors 102 located in the area where the effect of the noise or vibration is supposed to be mitigated. The output of the Error Sensors is denoted by the vector e of length K. As noted above, the plant path exists regardless of the presence of any attempt at active control. In the absence of control, the Plant Path would result in a vector of K Error Sensor signals $e_u$. These signals cannot be measured while the control system is turned on.

The control problem as noted above consists of driving a plurality of J Actuators 103 (such as loudspeakers for sound or piezoelectric actuators for vibrations) through an actuator input vector a of length J, in such a manner that the Error Sensors 102 receive energy from the Control Path that resembles as closely as possible the energy already coming in through the Plant Path, but in an opposite phase so that the total energy in the vector e is minimized. For this purpose, in a feed-forward control system, the noise sources are characterized by use of I Noise Reference Sensors 104, which may be microphones for noise or accelerometers or other vibration sensors for vibrations. The outputs of these Reference Sensors 104 are denoted in FIG. 1 as r, a vector having dimension I. The task of optimally driving the Actuators 103 is performed by driving each Actuator using the several Noise Reference outputs, each through its own filter (Wiener Filters or equivalent 105). In summary, it is assumed that there are I Reference Sensors, J Actuators, and K Error Sensors.

The Filter Equation to be solved over any given time interval is then $$\Delta W\, T^{\dagger} + W\, \Delta T^{\dagger} = R^{-1}\, P, \tag{1}$$

where each quantity is a complex-valued function of frequency, and where

- W=the I×J matrix (I rows, J columns) of Wiener Filters connecting each of I Reference Sensor outputs to each of J Actuator inputs;
- T=the K×J matrix representing the physical acoustic and transducer transfer functions from each of J Actuator inputs to each of K Error Sensor outputs;
- ΔW and ΔT are the changes to be made during a given iteration to the Wiener Filters, or the computer's model of the system transfer functions, respectively;
- R=the IΔI averaged cross-spectral density matrix at a given frequency of the I reference sensors with respect to each other;
- P=the I×K averaged cross-spectral density matrix at a given frequency of the I Reference Sensors with respect to the K Error Sensors; and
- ($^{\dagger}$) and ($^{-}$1) refer respectively to Hermitian transposition (transposed complex conjugate of a matrix) and inversion, respectively. Since T has dimensions K×J, $T^{\dagger}$ must be J×K and similarly for ΔT.

It is apparent from FIG. 1 that the Control Path actually consists of an unknown matrix of Wiener Filters 105 and an unknown matrix of System Transfer Functions 103 and 106 in series. Therefore, an estimate of the transfer functions is requisite to the calculation of the Wiener Filters 105. Prior to the present invention, these transfer functions were usually measured experimentally. Since they are likely to change during the operation of the system, these functions are often determined through the use of independent "probe signals," as is done in the well-known Filtered-X algorithm noted above. In the present invention, the Wiener Filters 105 and Transfer Functions 103 and 106 are separately updated in independent iterations, where in any given iteration either W or T is assumed to be known, e.g., either ΔW or ΔT in the Filter Equation is held at zero for that iteration. The other item is then readily calculated using only measurements provided by the Reference Sensors and the Error Sensors.

Figure 2:
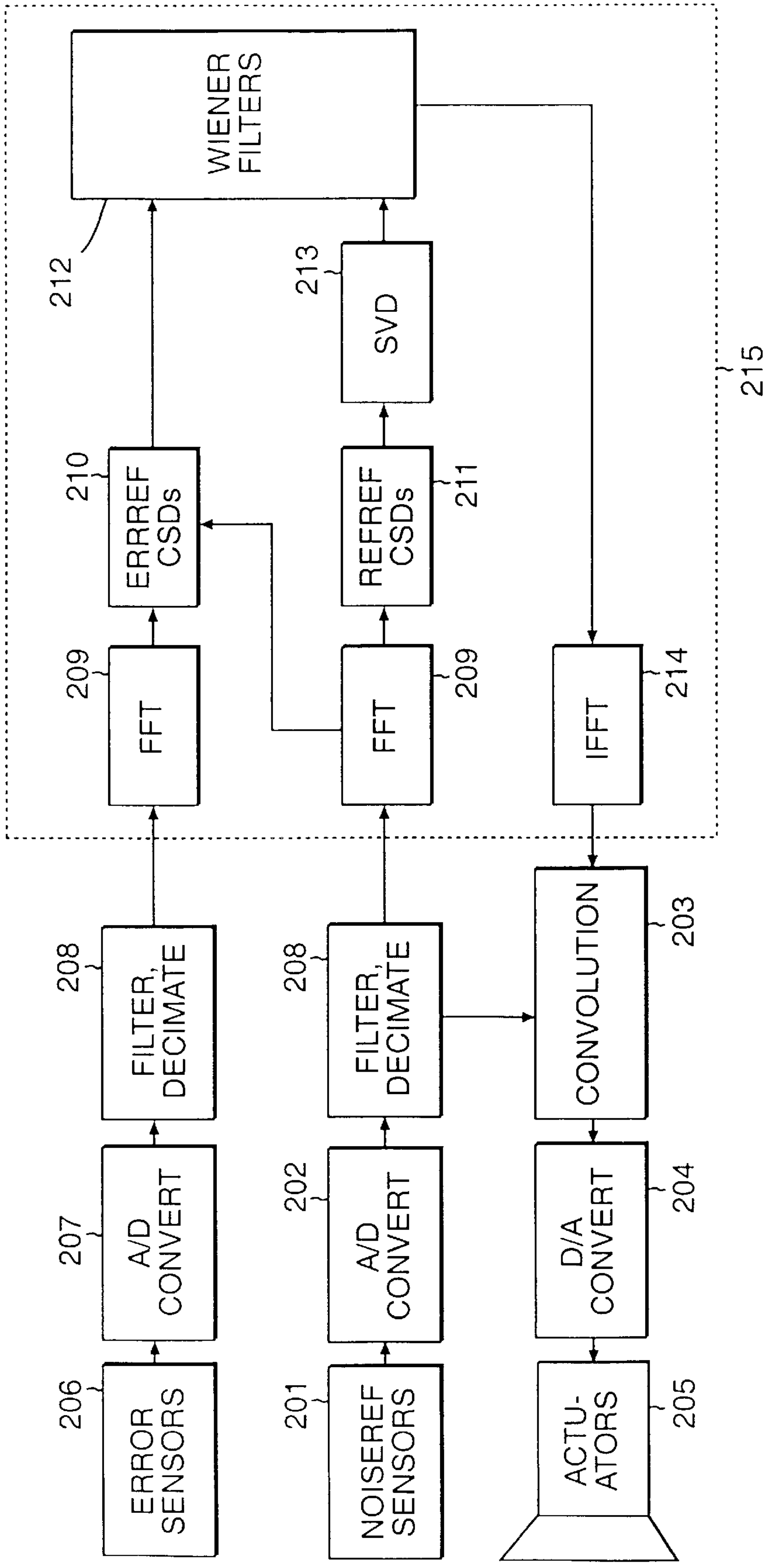
FIG. 2 shows a typical implementation of systems described in FIG. 1, including the necessary removal of reference redundancies and filtering prior to driving the actuators, wherein when the calculation of the Wiener Filters is performed in the frequency domain, it is normally done in so-called block-adaptive manner.

FIG. 2 illustrates a system implementation of a feed-forward Active Control System that describes one embodiment of how the process described in FIG. 1 takes place according to the present invention. First, Noise/Vibration Reference Sensors 201 are located or positioned in or with the sources of noise/vibration. Error Sensors 206 are positioned in or with the environment from which noise and/or vibrations are to be removed for the purpose of monitoring that environment. Outputs of the Noise/Vibration Reference Sensors 201 that are generated as a result of the noise and/or vibrations are passed through an Analog-to-Digital (A/D) Converter 202 that incorporates appropriate anti-aliasing filters. Similarly, outputs of the Error Sensors 206 that are generated as a result of any noise and/or vibrations in the environment to be quieted are passed through an Analog-to-Digital (A/D) Converter 202 that incorporates appropriate anti-aliasing filters. After passing through Filter and Decimator devices 208, the outputs of both the Error Sensors and the Reference Sensors are passed into a Filter Calculation device 215, which obtains optimal filter values.

In another loop, the A/D converted, Filtered and Decimated outputs of the Noise Reference Sensors 208 are passed directly through the Convolution-Filter 203 obtained in the Filter Calculation device 215, through a D/A Converter 204, and finally sent to the anti-noise or anti-vibration Actuators 205. The Actuators 205 then generate a noise/vibration cancelling output to counteract the noise and/or vibrations in the environment. The time taken for this process is made as short as possible because of the potential problem of latency, as mentioned above. This is done by keeping the convolution filters short and by optimizing using assembly language the coding of the filtering process for use on the particular DSP (digital signal processing) chip being used.

The above described preferred embodiment for conducting the filtering of the Noise Reference Sensor data by means of convolution can be replaced by instead performing the filtering of the FFTd Reference Sensor data via multiplication by the by the Filter Constants in the frequency domain. This method is presently not the preferred embodiment, because it would presently require block processing the filtering of data in the frequency domain, which would add unacceptably to the latency time. However, by using so-called "sliding FFT's" and/or by decomposing the required Reference-Reference matrices via an updating scheme that makes use of the results of the most recently calculated eigenvalues and eigenvectors to reduce the processing time for decomposition, and with computers becoming ever more capable, one may be able in the future to apply the Wiener or similar filtering in the frequency domain, thus avoiding convolution. The updating scheme to which reference has been made may in fact be implemented in the preferred embodiment algorithm for solving the Filter Equation by matrix decomposition. It can be accomplished as follows: First, transform the current Reference-Reference correlation matrix or cross-spectral density matrix by means of the most recently obtained matrix of eigenvectors, which will render that matrix to be more nearly diagonal than its original version. Then, diagonalize what remains and simply combine the two transformations into a single one which is then the new matrix of eigenvectors to be used for the calculation of new Filter Constants.

To constantly or periodically update the filter values as required in device 215, according to this first embodiment of the invention, outputs from the Error Sensors 206, as well as the Noise/Vibration Reference Sensors, pass through corresponding Analog-to-Digital (A/D) Converters 207 each of which incorporates appropriate anti-aliasing filters. These signals are then passed through the Filter and Decimator device 208. In a preferred embodiment of the filter calculation device 215, the signals are converted to the frequency domain using a Fast Fourier Transform (FFT) device 209 or equivalent. Normally, an appropriate Window function is applied prior to the FFT device, in order to reduce aliasing effects. From these outputs, cross-spectral-density (CSD) matrices are calculated via CSD devices 210, 211 and then averaged over several time intervals. In the preferred embodiment of the filter calculation device 215, at least some of the operations such as FFT, calculations of the CSD's, and the SVD are implemented is software for a computer or other data processing device.

As already indicated in the Filter Equation, two kinds of averaged (expected values) CSD's are required: those of the Error Sensors 206 with respect to the Reference Sensors 201 via CSD device 210 (matrix P), and those of the Reference Sensors 201 with respect to each other via CSD device 211 (matrix R). These matrices are then sufficient to calculate and generate the required characteristics for the Wiener Filters 212 in the frequency domain assuming that they are free from redundancies. To remove such redundancies, an SVD device or equivalent 213 is used to process the outputted matrix R from the CSD device 211 before the matrix R is inputted into the Wiener Filters 212.

This SVD device 213 eliminates redundancies or ill-conditioning in the Reference-Reference correlation data using any one of a number of available techniques, including singular-value or eigenvalue decomposition; Gram-Schmidt orthogonalization; the Method of Principal Components; Eliminating the redundancies in the reference-reference cross-spectral data or their equivalent in the time domain in the form of cross-correlation data; and sorting out the cross-correlations in a known manner using lattice filters. Particularly for systems in which time delays between and among noises measured are not significant, the time domain cross-correlation matrices are simplified by permitting the use of zero-delay values only.

In one embodiment, a matrix of Reference-Reference cross-spectral densities (CSDs) (a matrix possessing so-called Hermitian symmetry) is decomposed or factored into a product of two unitary (complex orthogonal) matrices and a diagonal matrix of eigenvalues, according to methods well known in the art. The usual inverse of the diagonal matrix is simply that other diagonal matrix in which each eigenvalue has been replaced by its reciprocal. If however the original matrix is "ill-conditioned" as a result of redundancies in the Reference-Reference correlation data, then these eigenvalues will have a relatively large dynamic range which precludes any accurate solution of the Filter Equation. According to the Method of Singular-Value Decomposition, a threshold is set a priori. A typical such threshold may be, for example, 1 percent of the largest eigenvalue; the exact magnitude is not very critical. Then in the process of inversion or solving the Filter Equation, all those eigenvalues falling below the set threshold are replaced by zeros rather than by the large numbers that would be the reciprocal of these relatively small eigenvalues. The resulting inverse of the diagonal matrix, termed the matrix's "pseudo-inverse," is then free of the redundancies and the filter constants calculated from it are mathematically well behaved, meaningful, and accurate.

From the Wiener Filters 212, the signals undergo inverse FFT through the IFFT device 214 into the time-domain for defining the Convolution Filter 203 that acts on the Reference Sensor Outputs coming from the Filter and Decimator 208 to drive the Actuators 205.

Based on an estimate of the system transfer function T (as derived from an initial measurement or estimate, or from a set of updated values obtained according to a process discussed in connection with Eq. 3 below), the above-described Filter Equation (1) is readily solved for any required changes to the Wiener Filters 212. Setting $\Delta T^{\dagger}=0$ in Eq. 1, the solution for ΔW is given by $$\Delta W = R^{-1} P\, T (T^{\dagger}\, T)^{-1}. \tag{2}$$

It is noted that the quantity $T\,(T^{\dagger}T)^{-1}$ is sometimes termed a "pseudoinverse" of the matrix T. This is done since T, generally being a non-square matrix (number of Actuators need not equal number of Error Sensors) does not have an ordinary inverse. In the present embodiment, the concept of such a "pseudo-inverse" is extended a step further by applying a threshold to the eigenvalues of $(T^{\dagger}\ T)^{-1}$ during the process of obtaining the inverse, as is normally done in the matrix algebra procedure of Singular-Value Decomposition.

An initial estimate of T is readily obtained. By methods known in the art, these transfer functions T connecting the inputs to the Actuators to the outputs of the Error Sensors 206 can be initially calculated as ratios of respective measured Fourier Transforms of the quantities of interest. The process of updating T while the noise canceller is running can then be accomplished by a procedure similar to that used to update W. During an iteration for the purpose of updating the transfer functions, the Wiener Filters are held constant (ΔW=0) such that the transfer functions are readily updated according to $$\Delta T^{\dagger}=(W^{\dagger} W)^{-1} W^{\dagger} R^{-1} P. \quad (3)$$

The above comments about the pseudo-inverse also apply to the pseudo-inverse of the Wiener Filter matrix which is in general also non-square because the number of Reference Sensors need not equal the number of Actuators.

A constraint should be applied in order to prevent unnecessary drift of the Filters and Transfer Functions to very large or very small values. To see the underlying ambiguity, it is apparent for example that if one were to double all the Filters while halving all the Transfer Functions, then the total transfer function of the Control Path would be left unchanged. The same result would occur if the phase of each Filter were increased by, for example, 30 degrees while the phase of each Transfer Function were similarly retarded. To prevent such drift, one complex quantity (in each frequency bin) such as the amplitude and phase of the Transfer Function from one Actuator to one Error Sensor, should be held constant at its initial value. If one does not wish to discriminate with respect to a particular Transfer Function (for example because it might under some circumstances become zero), then some other quantity such as a normalized complex average value of all Transfer Functions will serve the same purpose.

When calculated corrections ΔW and ΔT are applied to the Wiener Filters and Transfer Functions, respectively, factoring in a damping factor may be desirable to prevent overshoot and to assure stability of the calculations. For example, the corresponding terms of ΔW and ΔT may be multiplied by a damping factor between 0 and 1, for example 0.9.

A legitimate question would be whether the system Transfer Functions so obtained will at all times correspond exactly to the actual physical transfer functions then existing. The answer of course is that they will generally not so correspond. However, this need be of no concern as long as both the Filters and the Transfer Functions are always adjusted in such a manner as to minimize the total energy received by the Error Sensors. And in any case, what really matters it the combined effect of the two items in series, forming the Control Path.

It is clear that a redundancy of reference sensor measurements can cause the cross-spectral density matrix R to be ill-conditioned and hard to solve accurately. However, this is not the only existing source of redundancies or illconditions. In the calculation of the filters, the matrix ($T^{\dagger}$ T) must also in effect be inverted. If there are too many Actuators and not enough Error Sensors, that matrix could be ill-conditioned as well. Moreover when the transfer functions are to be updated, it is necessary to invert the Wiener Filters themselves in the form of ($W^{\dagger}$ W). The present invention, in at least one embodiment as described herein, is directed to taking care of the redundancies in the reference measurements by effectively inverting R. Further, the present invention allows the other two types of inversion to be treated in the same manner, such as by using singular-value decomposition or an analogous robust matrix solving routine.

In the prior art, active control systems have been built in which the occurrence of undesired redundancies has been minimized by selecting relatively few Reference Sensors, a few more Actuators, and still more Error Sensors. Such configurations have been found adequate only for eliminating some redundancies. However, the present invention makes it possible to select the numbers and types of transducers to be used entirely on their merits, without concern about redundancies; the present invention will effectively remove any redundancies.

Reference sensors and their locations should be chosen and placed in such a manner as to assure that, in the language of vector spaces, their combined outputs span the space in which the plant noise at the error sensors appears. In other words, the Reference Sensors must characterize the offending noise or vibration if that noise or vibration is to be removed. The actuators, in turn, should be chosen and located in such a manner as to couple into the most significant noise or vibration modes of the space that needs to be quieted; they must be able to provide the same control noise or vibration as the plant noise or vibration that is to be canceled. Finally, the Error Sensors should be located in such a manner that they can adequately monitor the space to be quieted. All these requirements should be met over the entire range of frequencies over which control is to be established. In none of these choices should the avoidance of redundancies be an important concern and the invention makes this possible.

Figure 3:
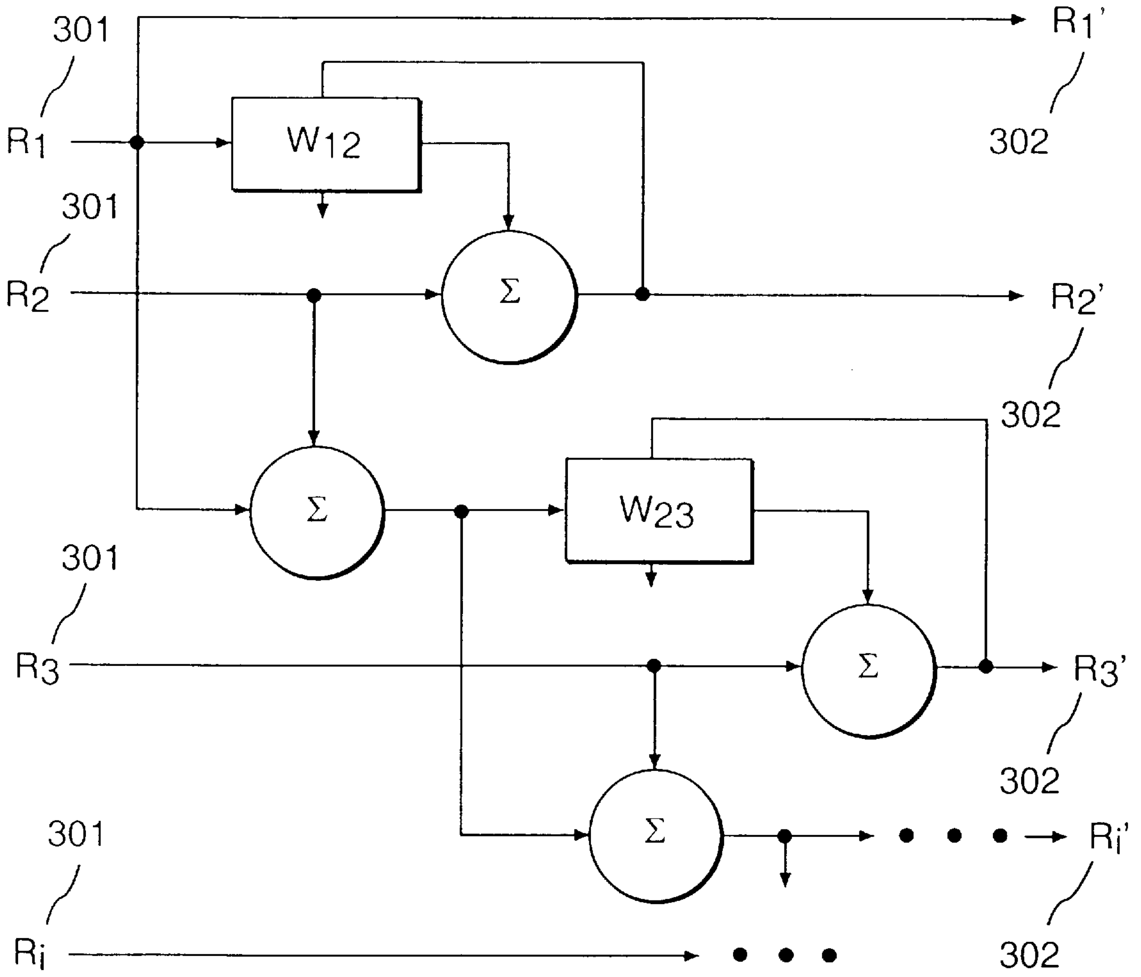
FIG. 3 shows a time-domain implementation for removing redundancies in an active noise control environment according to the present invention.

Noise cancellation can take place as readily in the time-domain as in the frequency domain. In the time-domain, the role of cross-spectral density matrices is replaced by cross-correlation matrices. There are also available methods other than singular-value decomposition to accomplish the purpose of eliminating destructive redundancies in the reference information used to calculate and define the Wiener Filters. Notable such methods include the well-known Gram-Schmidt orthonormalization procedure or the use of lattice filters as indicated in FIG. 3, or the so-called Method of Principal Components. All these methods constitute other ways to obtain an orthogonal basis for any given set of vectors (noise sources) which are picked up.

The procedure depicted in FIG. 3 consists essentially of the following: given a first one of the given vectors 301 as indicated, any component of a second vector that is parallel to the first is taken away while the part of the second vector that is orthogonal to the first is retained. In the next step, the part of a third vector that is orthogonal to the other two is retained. This process continuous until the last vector is taken into account. The result is a set of vectors $R_1'$, $R_2'$, $R_3'$, . . . $R_i'$ 302, each of which is orthogonal to all the others. To eliminate redundancies, one can then eliminate those orthogonal vectors which are below a given threshold in a manner similar to that of the above described Method of Singular-Value Decomposition.

The vectors themselves represent the signals that are received by the reference sensors 201 of FIG. 2. In the many applications in which reference-reference and primary-reference correlations involve time delays, the signal vectors which form the correlation matrix must each correspond to not only a given sensor pair but also to a given combination of time delays. When the Gram-Schmidt procedure is applied to such problems, then primary and reference signals can each be put through a lattice filter in order to obtain a reasonable set of delayed signals for each primary signal and for each reference signal. Both reference-reference and primary-reference correlations are required.

It is important to note that there are systems in which there are no significant time delays between various pairs of signals. This is more likely to occur in signal separation systems such as medical artifact removal systems than in active control situations. However, if time delays are not important in a particular application, then the ordinary time-domain procedure (as described in the '237 patent) and dealing with cross-correlation rather than cross-spectral density matrices becomes particularly simple to use. There will be but a single matrix to invert (rather than one in each frequency bin of a frequency domain analysis), and its size will be the number of References times the number of References, instead of that quantity multiplied in each case by the number of time delay taps to be applied.

Figure 4:
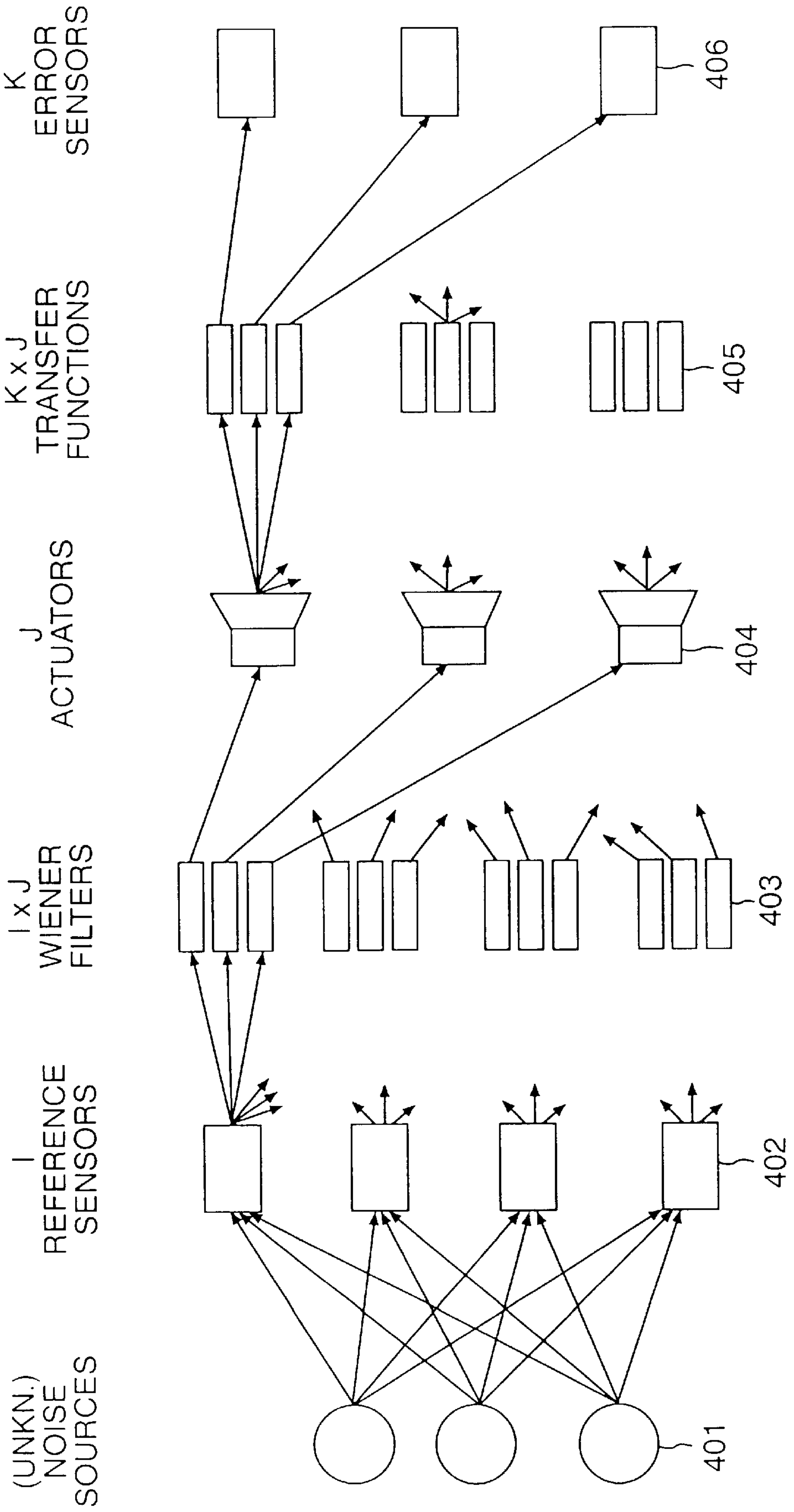
FIG. 4 shows the multi-channel characteristics of a typical feed-forward active control system.

FIG. 4 depicts the multi-channel aspects of a typical active canceller of noise and/or vibration, according to the present invention. There is a generally unknown number of significant independent sources of noise or vibration 401 whose outputs are transmitted through a plant path (not shown) to the K Error Sensors 406. These noise/vibration sources are picked up by I Reference Sensors 402. Their outputs are passed through a set of Wiener Filters or equivalent 403 to drive a set of J Actuators 404. Each Reference Sensor is connected to each actuator through a Wiener Filter, which is a function of frequency, so that there are I×J such filters at any given frequency. In the frequency domain, each filter constant is comprised of a complex number to represent amplification and phase shift. The inputs to the Actuators 405 traverse a set of unknown Transfer Functions 405 which include the Actuator itself, the air or structural path from the Actuator to the Error Sensor, and the transfer function of the Error Sensor itself. Again, each Actuator is coupled to each Error Sensor to form that single combination's Transfer Function, whereby there is a totality of K×J combination Transfer Functions. A function of the present invention is to adjust the Wiener Filters and by implication its "knowledge" of the Transfer Functions, in such a manner as to minimize the combined energy on the Error Sensors stemming from the combined Plant and Control paths.

Figure 5:
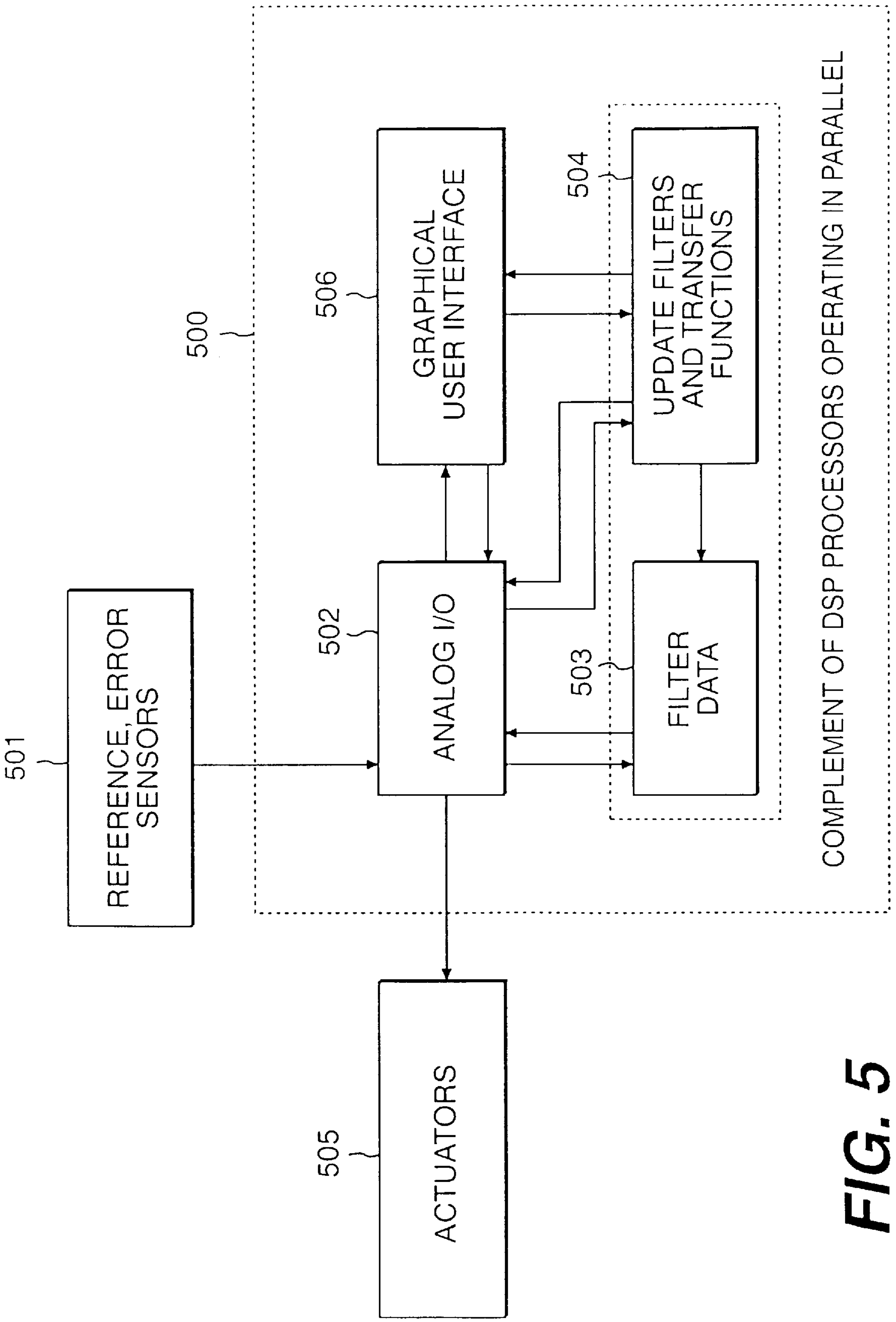
FIG. 5 illustrates a general block diagram of the components for the implementation of a preferred embodiment of the present invention.

As illustrated in FIG. 5, the invention is generally implemented and embodied in a controller 500 which makes use of state of the art digital signal processing technology for its individual components. The controller 500 includes a number of DSP processor devices 503, 504 as known in the art, working in parallel to perform the required decimation, filtering and other devices as shown in FIG. 2. The two major functions accomplished by the DSP processors are the generating of filtered data based on the Wiener Filtering of the Reference Sensor outputs (DSP processor device 503) and the periodic adaptive updating of the Wiener Filters and Transfer Functions (DSP processor device 504). The Analog I/O device 502 performs appropriate anti-aliasing, decimation, and FIR filtering functions for the Reference Sensor outputs, the Error Sensor outputs, and the filtered data for driving the Actuators. The time series data from the Reference Sensors is immediately subjected to time domain filtering through DSP processor device 503, using Wiener Filters which were previously calculated in DSP processor device 504. The Wiener-Filtered reference signals are then applied directly to the Actuators 505, in a manner as to minimize latency time. The process of updating the Wiener Filters via DSP processor device 504 also includes periodic updates of the system transfer functions. Selection of important system parameters such as choices of channels to use, averaging time, windowing, eigenvalue threshold settings for eliminating low-level signals according to a singular-value decomposition algorithm, and the like is performed by use of a Graphic User Interface 506.

With respect to FIG. 2, the functions and operations performed by the DSP processors include those of the FFT devices 209, the determination of the Error-Reference CSD 210, the determination of the Reference-Reference CSD 211, the Wiener Filters 212, the SVD device 213 and the IFFT device 214. These functions and operations are therefore implemented as software in the DSP processor devices 503, 504, wherein each of the DSP processor devices 503, 504 may be composed of a plurality of actual DSP processor circuits as known in the art. However, as would be understood by one of skill in the art, such functions and operations may also be accomplished using different combinations of software and hardware implementations. Further, the functions and operations of the DSP processor devices 503, 504 may also be implemented in other equivalent data processing or signal processing devices, mainframes computers, minicomputers, etc.

In one specific example implementation of the present invention, reference sensors may be imbedded in the floor below a vibration isolation table, to sense floor vibrations which are transmitted to the legs of the table. A piezoelectric actuator is embedded in each of the table's legs to counter the vibration induced from the floor. The work surface is equipped with a number of error sensors to measure any motion of the work area. The four reference detectors, one in each table leg, are used to assure that all significant sources of floor vibration are detected and detector signal contributions which do not represent independent noise sources are eliminated. Cross-correlation data based on signals received from the various reference detectors is used to construct a cross-spectral density matrix. Using a known orthogonalization procedure, the matrix is solved and eigenvalues of the reduced matrix falling below a predetermined threshold value are eliminated, thereby eliminating reference signal contributions from the primary signal source and from reference sensors not representing independent noise sources. The remaining values of the reduced matrix are used in combination with reference-to-primary sensor correlation data to define filter constants. The filter constants are applied to power-spectral density data pertaining to the reference sensors in a known manner in order to remove signal contributions equivalent to those detected by the reference sensors. Advantageously, using a large number of reference detectors and eliminating those signal contributions which do not represent independent noise sources provides greatly improved output signals for sonar detection and for other applications where a primary signal is present in the presence of a variety of noise sources.

In accordance with one implementation of this invention for the case of signal separation, a noise-canceled output signal may be generated by storing a data record of signal values representative of detected primary output signals and reference output signals, converting the stored data to frequency domain signal values, generating filter constants in terms of frequency domain values and either bringing the filters back to the time domain for convolution filtering (especially useful in active control to minimize latency), or apply the frequency domain filter constants to signal values of the data record transformed into the frequency domain and transforming the resultant values to the time-domain. Advantageously, these methods provide active control or a noise-canceled output signal in terms of time-domain values while employing the advantages of frequency domain computational operations. An advantage of performing much of the calculations in the frequency domain as described above is that it leads to solving for the filters a separate matrix equation in each frequency bin, where the matrices have the dimensions of the number of reference sensors. If the calculations is done in the time-domain, the dimensions of the matrix to be solved are the number of references times the number of time delay taps to be employed. True, there is only a single matrix equation instead of one for each frequency bin, but its much larger size usually more than makes up for that advantage. On the other hand, for noise control problems for which there are no significant time delays between any of the prevailing signals and noise sources, such as perhaps some medical instrumentation applications, a time-domain method is likely to be the method of choice since then the matrix equation dimension is also as large as the number of references—zero delays only are applied.

In another example implementation, the present invention is employed in generating an electro-encephalogram of an epilepsy patient while undergoing a seizure. In this application, electrical artifact generated by eye motion and by facial, neck, and scalp muscles are used as noise references to remove ocular and muscle artifact from the desired electro-encephalogram. In this embodiment, a plurality of scalp electrodes are used as primary sensors to generate a plurality of traces for an electro-encephalogram. A relatively large number of reference sensors are positioned in other areas to detect noise resulting from muscle activity and eye motion. The outputs from the reference sensors and the primary sensors are multiplexed and applied to a digital computer, where a cross-correlation matrix is constructed defining cross-correlation values based on the outputs of the reference sensors. The matrix is solved using a known singular value decomposition technique and correlation values below a predetermined threshold are eliminated. The remaining values of the reduced matrix are used to define filter constants which are applied to the reference sensor outputs and the filtered outputs are subtracted from the primary sensor outputs to define the desired electro-encephalogram. The computer applies the synthesized output signals to the electro-encephalogram output or other recording device. Advantageously, as many sensors as desired may be used in an environment where it is not known how many noise sources will influence a signal, since redundancy of the reference sensor outputs is eliminated by the present invention.

Beyond the exemplary applications discussed herein, the invention may advantageously be employed in a variety of active control and signal separation applications, where noise or vibration stemming from multiple sources needs to be actively canceled, or where a primary signal is to be detected in the presence of multiple noise sources or noise modes. The invention may, for example, be advantageously used in household applications of active noise or vibration control, in reducing interior noise in automobiles, aircraft, and other vehicles, in mitigating noise in various environments such as airports and road systems and their neighborhoods, in fetal electrocardiography and fetal pulse oximetry, in heart transplant electrocardiography to generate an electrocardiogram of nerve center activity of the old heart in the presence of much stronger signals from the transplanted heart. Other areas of application for the invention include such areas as sound detection, telephony, radar, television, etc., wherein a signal is to be detected in a noisy environment. The potential applications appear too numerous to be certain of foreseeing all of them, and the most advantageous ones will undoubtedly emerge with additional experience. It is the fundamental multi-channel method and its implementation in a controller, active or signal separation, which is the subject of the present patent and its referenced precedent.

Although the present invention has been fully described in connection with the preferred embodiment thereof with reference to the accompanying drawings, it is to be noted that various changes and modifications will be apparent to those skilled in the art. For example, the controller 500 may be implemented using alternative means for eliminating offending redundancies; it might employ entirely time domain calculations; or it might make use of a modified LMS algorithm that meets the demand of eliminating redundancies while being less computation intensive than directly solving the Filter matrix equations. Such changes and modifications are to be understood as included within the scope of the present invention as defined by the appended claims, unless they depart therefrom.

What is claimed is:

1. A method for feed-forward active control of noise and vibration cancellation, said method comprising the steps of:

detecting at least one of noise and vibration from potential noise and vibration sources, said step of detecting noise and vibration including providing at least one noise/vibration reference sensor for detecting aid noise and vibration from said potential noise and vibration sources;

generating noise reference data based on said detection of noise and vibration from said potential noise and vibration sources;

detecting at least one of noise and vibration at a selected environment in which noise and vibration are to be minimized said step of detecting noise and vibration at said selected environment including providing at least one error sensor for detecting said noise and vibration at said selected environment;

generating error data based on said detection of noise and vibrations at said selected environment;

generating filter constants based on said noise reference data and said error data, said step of generating said filter constants includes cross-correlating said error data with said noise reference data so as to generate cross-correlation data and eliminating redundancies in said noise reference data using said cross-correlation data;

processing said noise reference data based on said generated filter constants; and generating noise/vibration canceling outputs based on said processed noise reference data to minimize energy of said noise and vibration detected at said selected environment, said step of generating noise/vibration canceling outputs including providing at least one actuator for generating said noise/vibration canceling outputs and inputting said noise/vibration canceling outputs into said selected environment.

2. A method according to claim 1, further comprising the steps of:

providing a plurality of noise/vibration reference sensors for detecting said noise and vibration from said potential noise and vibration sources;

providing a plurality of error sensors for detecting said noise and vibration at said selected environment; and providing a plurality of actuators for generating said noise/vibration canceling outputs.

3. A method according to claim 2, further comprising the step of:

updating said filter constants based on estimates of system transfer functions from inputs of said plurality of actuators to outputs of said plurality of error sensors.

4. A method according to claim 3, wherein said step of updating said filter constants includes eliminating ill-conditioning in pseudo-inversions of said system transfer functions.

5. A method according to claim 3, wherein said step of updating said filter constants includes updating said estimates of said system transfer functions directly from inputs of said plurality of actuators to outputs of said plurality of error sensors.

6. A method according to claim 5, wherein said step of updating said estimates of said system transfer functions includes eliminating ill-conditioning in pseudo-inversions of said filter constants.

7. A method according to claim 1, further comprising the steps of:

configuring a number of said reference sensors, error sensors and actuators such that when a single element of at least one said reference sensors, error sensors or actuators is used, a plurality of elements of at least one of the remaining reference sensors, error sensors and actuators is provided.

8. A method according to claim 7, further comprising the step of:

updating said filter constants based on estimates of system transfer functions from an input of said at least one actuator to an output of said at least one error sensor.

9. A method according to claim 8, wherein said step of updating said filter constants includes eliminating ill-conditioning in pseudo-inversions of said system transfer functions.

10. A method according to claim 8, wherein said step of updating said filter constants includes updating said estimates of said system transfer functions directly from said input of said at least one actuator to said output of said at least one error sensor.

11. A method according to claim 10, wherein said step of updating said estimates of said system transfer functions includes eliminating ill-conditioning in pseudo-inversions of said filter constants.

12. A method according to claim 1, wherein said step of generating filter constants further includes cross-correlating said error data with said noise reference data to generate error-reference correlation data, cross-correlating said noise reference data with each other to generate reference-reference correlation data, said step of eliminating redundancies includes eliminating redundancies in said reference-reference correlation data, and said step of generating said filter constants is based on said error-reference correlation data and said redundancy-free reference-reference correlation data.

13. A method according to claim 12, wherein said step of eliminating redundancies in said reference-reference correlation data includes conducting a singular-value decomposition of said reference-reference correlation data.

14. A method according to claim 12, wherein said step of eliminating redundancies in said reference-reference correlation data includes conducting an eigenvalue decomposition of said reference-reference correlation data.

15. The method according to claim 12, wherein said step of generating filter constants includes generating filter constants for defining a Wiener filter.

16. The method according to claim 15, wherein said step of processing said noise reference data includes filtering said noise reference data based on said Wiener filter.

17. The method according to claim 12, wherein said step of generating said filter constants further includes introducing a damping factor to said filter constants.

18. The method according to claim 1, wherein said step of generating filter constants includes generating filter constants for defining a Wiener filter.

19. The method according to claim 1, wherein said step of processing said noise reference data includes filtering said noise reference data based on said filter constants.

20. The method according to claim 1, wherein said step of generating said filter constants further includes introducing a damping factor to said filter constants.

21. A method for feed-forward active control of multichannel noise and vibration cancellation, said method comprising the steps of:

providing a configuration of noise/vibration reference sensors, error sensors and actuators for minimizing energy of at least one of noise and vibration at a selected environment;

detecting at least one of noise and vibration from potential noise and vibration sources via said noise/vibration reference sensors;

generating noise reference data based on said detection of noise and vibration from said potential noise and vibration sources;

detecting at least one of noise and vibration at said selected environment via said error sensors;

generating error data based on said detection of noise and vibrations at said selected environment;

generating filter constants based on said noise reference data and said error data, said step of generating said filter constants including cross-correlating said error data with said noise reference data so as to generate cross-correlation data and eliminating redundancies in said noise reference data using said cross-correlation data;

processing said noise reference data based on said generated filter constants; and generating noise/vibration canceling outputs based on said processed noise reference data via said actuators to minimize energy of said noise and vibration detected at said selected environment, said step of generating noise/vibration canceling outputs including inputting said noise/vibration canceling outputs into said selected environment via said actuators.

22. A method according to claim 21, wherein said step of providing said configuration of noise/vibration reference sensors, error sensors and actuators includes providing a plurality of noise/vibration reference sensors for detecting said noise and vibration from said potential noise and vibration sources, providing a plurality of error sensors for detecting said noise and vibration at said selected environment, and providing a plurality of actuators for generating said noise/vibration canceling outputs.

23. A method according to claim 22, further comprising the step of:

updating said filter constants based on estimates of system transfer functions from inputs of said plurality of actuators to outputs of said plurality of error sensors.

24. A method according to claim 23, wherein said step of updating said filter constants includes eliminating ill-conditioning in pseudo-inversions of said system transfer functions.

25. A method according to claim 23, wherein said step of updating said filter constants includes updating said estimates of said system transfer functions directly from inputs of said plurality of actuators to outputs of said plurality of error sensors.

26. A method according to claim 25, wherein said step of updating said estimates of said system transfer functions includes eliminating ill-conditioning in pseudo-inversions of said filter constants.

27. A method according to claim 21, wherein said step of providing said configuration of noise/vibration reference sensors, error sensors and actuators includes providing a plurality of elements of at least one of said reference sensors, error sensors and actuators when providing a single element of at least one of said remaining reference sensors, error sensors or actuators.

28. A method according to claim 21, wherein said step of generating filter constants further includes cross-correlating said error data with said noise reference data to generate error-reference correlation data, crosscorrelating said noise reference data with each other to generate reference-reference correlation data, eliminating redundancies in said reference-reference correlation data, and generating said filter constants based on said error-reference correlation data and said redundancy-free reference-reference correlation data.

29. The method according to claim 28, wherein said step of generating said filter constants further includes introducing a damping factor to said filter constants.

30. A method according to claim 21, further comprising the step of:

updating said filter constants based on estimates of system transfer functions from inputs of said actuators to outputs of said error sensors.

31. A method according to claim 30, wherein said step of updating said filter constants includes eliminating ill-conditioning in pseudo-inversions of said system transfer functions.

32. A method according to claim 30, wherein said step of updating said filter constants includes updating said estimates of said system transfer functions directly from said inputs of said actuators to said outputs of said error sensors.

33. A method according to claim 32, wherein said step of updating said estimates of said system transfer functions includes eliminating ill-conditioning in pseudo-inversions of said filter constants.

34. The method according to claim 21, wherein said step of generating said filter constants further includes introducing a damping factor to said filter constants.

35. A system for the feed-forward active control of noise and vibration cancellation, comprising:

a first means for detecting at least one of noise and vibration from potential noise and vibration sources, said first detecting means including a plurality of noise/vibration reference sensors operatively positioned to detect said noise and vibration from said potential noise and vibration sources;

means for generating noise reference data based on said noise and vibration from said potential noise and vibration sources detected by said first detecting means;

a second means for detecting at least one of noise and vibration at a selected environment in which noise and vibration are to be minimized, said second detecting means includes a plurality of error sensors operatively positioned to detect said noise and vibration at said selected environment;

means for generating error data based on said noise and vibrations at said selected environment detected by said second detecting means;

means for generating filter constants based on said noise reference data and said error data, said generating means including means for cross-correlating said error data with said noise reference data to generate cross-correlation data and means for eliminating redundancies in said noise reference data using said cross-correlation data;

means for processing said noise reference data based on said generated filter constants; and means for generating noise/vibration canceling outputs based on said processed noise reference data to minimize energy of said noise and vibration detected at said selected environment, said noise/vibration canceling output generating means including a plurality of actuators for generating said noise/vibration canceling outputs, said plurality of actuators being operatively positioned to input said noise/vibration canceling outputs into said selected environment.

36. A system according to claim 35, wherein a number of each of said reference sensors, error sensors and actuators is selected whereby when a single element of one of said reference sensors, error sensors or actuators is used, a plurality of elements of remaining reference sensors, error sensors or actuators is provided.

37. A system according to claim 36, wherein said means for generating said filter constants includes means for updating said filter constants based on estimates of system transfer functions from inputs of said actuators to outputs of error sensors.

38. A system according to claim 37, wherein said means for updating said filter constants includes means for eliminating ill-conditioning in pseudo-inversions of said system transfer functions.

39. A system according to claim 37, wherein said means for updating said filter constants includes means for updating said estimates of said system transfer functions directly from said inputs of said actuators to said outputs of said error sensors.

40. A system according to claim 39, wherein said means for updating said estimates of said system transfer functions includes means for eliminating ill-conditioning in pseudo-inversions of said filter constants.

41. A system according to claim 35, wherein said means for generating filter constants further includes means for cross-correlating said error data with said noise reference data to generate error-reference correlation data, means for cross-correlating said noise reference data with each other to generate reference-reference correlation data, means for eliminating redundancies in said reference-reference correlation data, and means for generating said filter constants based on said error-reference correlation data and said redundancy-free reference-reference correlation data.

42. A system according to claim 35, wherein said means for generating said filter constants includes means for updating said filter constants based on estimates of system transfer functions from inputs of said plurality of actuators to outputs of said plurality of error sensors.

43. A system according to claim 42, wherein said means for updating said filter constants includes means for eliminating ill-conditioning in pseudo-inversions of said system transfer functions.

44. A system according to claim 42, wherein said means for updating said filter constants includes means for updating said estimates of said system transfer functions directly from inputs of said plurality of actuators to outputs of said plurality of error sensors.

45. A system according to claim 44, wherein said means for updating said estimates of said system transfer functions includes means for eliminating ill-conditioning in pseudo-inversions of said filter constants.

* * * * *